United States Patent
Yuasa

(10) Patent No.: US 8,647,714 B2
(45) Date of Patent: Feb. 11, 2014

(54) NICKEL FILM FORMING METHOD

(75) Inventor: Hideki Yuasa, Kurokawa-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/599,365

(22) Filed: Aug. 30, 2012

(65) Prior Publication Data

US 2013/0059079 A1 Mar. 7, 2013

(30) Foreign Application Priority Data

Sep. 2, 2011 (JP) ................................. 2011-191917

(51) Int. Cl.
*C23C 16/06* (2006.01)

(52) U.S. Cl.
USPC .................. 427/250; 427/248.1; 427/255.11; 427/255.23; 427/255.28

(58) Field of Classification Search
None
See application file for complete search history.

(56) References Cited

U.S. PATENT DOCUMENTS

| | | | |
|---|---|---|---|
| 5,840,626 A | 11/1998 | Ohguro | |
| 2003/0032210 A1* | 2/2003 | Takayama et al. | 438/30 |
| 2006/0141155 A1* | 6/2006 | Gordon et al. | 427/255.19 |
| 2010/0046138 A1* | 2/2010 | Do et al. | 361/305 |
| 2010/0124609 A1* | 5/2010 | Quick et al. | 427/255.28 |
| 2011/0163076 A1* | 7/2011 | Kawaguchi | 219/121.61 |
| 2012/0183689 A1 | 7/2012 | Suzuki et al. | |

FOREIGN PATENT DOCUMENTS

| | | |
|---|---|---|
| JP | 9-153616 | 6/1997 |
| KR | 2009-0085645 | 8/2009 |
| KR | 2011-0050646 | 5/2011 |
| WO | 2007/116982 A1 | 10/2007 |
| WO | 2010/010538 | 1/2010 |
| WO | 2011/040385 A1 | 4/2011 |

OTHER PUBLICATIONS

Lim, Nature Materials, V2, Nov, 2003; p749.*

* cited by examiner

*Primary Examiner* — Joseph Miller, Jr.

(74) *Attorney, Agent, or Firm* — Oblon, Spivak, McClelland, Maier & Neustadt, L.L.P.

(57) ABSTRACT

In a nickel film forming method, an initial Ni film is formed on a substrate by a chemical vapor deposition (CVD) process by using a nickel-containing compound having a molecular structure in which a ligand containing a nitrogen-carbon bond is included and nitrogen of the ligand coordinates with nickel as a film forming source material and at least one selected from ammonia, hydrazine, and derivatives thereof as a reduction gas. Further, a main Ni film is formed on the initial Ni film by CVD by using the nickel-containing compound as the film forming source material and hydrogen gas as the reduction gas.

9 Claims, 4 Drawing Sheets

NICKEL FILM FORMING METHOD

CROSS-REFERENCE TO RELATED APPLICATIONS

This application claims priority to Japanese Patent Application No. 2011-191917 filed on Sep. 2, 2011, the entire contents of which are incorporated herein by reference.

FIELD OF THE INVENTION

The present invention relates to a nickel film forming method for forming a nickel film by using a chemical vapor deposition (CVD) process.

BACKGROUND OF THE INVENTION

In recent years, there is a demand for a semiconductor device having a high-speed operation and a low power consumption. For example, in order to realize low resistance of a source/drain contact or a gate electrode of a metal-oxide-semiconductor (MOS), a silicide is formed by a salicide process. As the silicide, attention is given to a nickel silicide (NiSi) capable of consuming a small amount of silicon and having low resistance.

To form a NiSi film, there is widely used a method in which a nickel (Ni) film is formed on a silicon substrate or a poly-silicon substrate by a physical vapor deposition (PVD) process, such as a sputtering or the like, and then subjected to an annealing under an inert gas atmosphere (see, e.g., Japanese Patent Application Publication No. H09-153616 (corresponding to U.S. Pat. No. 5,840,626)).

Further, the Ni film itself may be used for a capacitor electrode of DRAM.

However, such PVD process has poor step coverage. For this reason, along with miniaturization of semiconductor devices, there has been proposed a method for forming the Ni film by a chemical vapor deposition (CVD) process having a better step coverage (see, e.g., International Application Publication No. WO2007/116982).

When the Ni film is formed by the CVD process, a nickel amidinate is used as a film forming source material (precursor) and $NH_3$ is used as a reduction gas. In this case, however, N (nitrogen) is included in process gases and thus introduced into the film. Accordingly, the nickel nitride ($Ni_xN$) is formed during the Ni film forming process, and the resulting Ni film includes impurities such as N (nitrogen), having high resistance.

To solve the foregoing problems, International Application Publication No. WO2011/040385 discloses a method of removing the N in the film by modifying the film under a hydrogen atmosphere after the Ni film including the N is formed by using a nickel amidinate and $NH_3$.

However, the addition of such post process after forming the film causes an increase in a process time, which leads to a decrease of throughput. Further, in the method described in International Application Publication No. WO2011/040385, the film forming process and the modification process need to be repeatedly performed multiple times to raise the purity of the Ni film, so that the process time becomes longer.

SUMMARY OF THE INVENTION

In view of the above, the present invention provides a Ni film forming method for forming a Ni film having less impurities with high throughput by using a CVD process.

In accordance with an aspect of the present invention, there is provided a nickel film forming method including: forming an initial Ni film on a substrate by chemical vapor deposition (CVD) using a nickel-containing compound having a molecular structure in which a ligand containing a nitrogen-carbon bond is included and nitrogen of the ligand coordinates with nickel as a film forming source material and at least one selected from ammonia, hydrazine, and derivatives thereof as a reduction gas; and forming a main Ni film on the initial Ni film by CVD using the nickel-containing compound as the film forming source material and hydrogen gas as the reduction gas.

In accordance with another aspect of the present invention, there is provided a non-transitory computer-readable storage medium storing therein a computer-executable program configured to control a film forming apparatus, wherein, when executed, the program controls the film forming apparatus to perform the Ni film forming method described above.

BRIEF DESCRIPTION OF THE DRAWINGS

The objects and features of the present invention will become apparent from the following description of embodiments, given in conjunction with the accompanying drawings, in which.

DETAILED DESCRIPTION OF EMBODIMENTS

Figure 1:
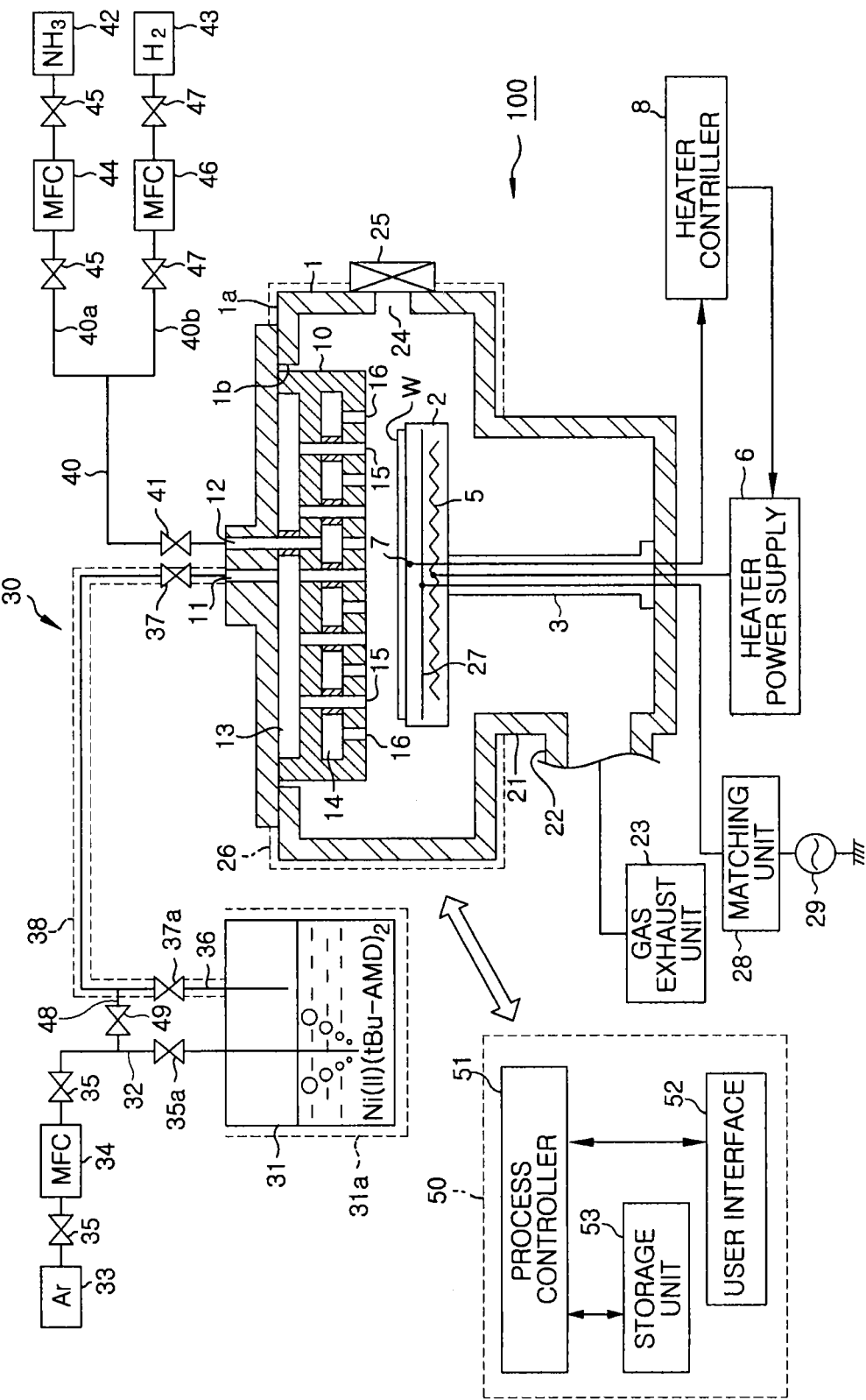
FIG. 1 is a schematic view illustrating a film forming apparatus used to carry out a Ni film forming method in accordance with an embodiment of the present invention.

Hereinafter, an embodiment of the present invention will be described with reference to the accompanying drawings which form a part hereof. Throughout the drawings, like reference numerals will be given to like parts, and redundant description thereof will be omitted.

FIG. 1 is a schematic view illustrating a film forming apparatus for carrying out a Ni film forming method in accordance with an embodiment of the present invention.

The film forming apparatus 100 includes a substantially cylindrical airtight chamber 1. In the chamber 1, a susceptor 2 is provided to horizontally support thereon a wafer W that is a substrate to be processed. The susceptor 2 is supported by a cylindrical supporting member 3 extending from a bottom portion of a gas exhaust room 21 to be described later so as to a central lower portion of the susceptor 2. The susceptor 2 is made of ceramic, such as AlN or the like. Further, a heater 5 is embedded in the susceptor 2 and is connected to a heater power supply 6.

A thermocouple 7 is embedded in a portion close to an upper surface of the susceptor 2, and a signal detected from the thermocouple 7 is transmitted to a heater controller 8. The heater controller 8 transmits an instruction to the heater power supply 6 in response to the signal detected from the thermocouple 7, and controls a temperature of the wafer to be a predetermined level by controlling the heating of the heater 5. An electrode 27 to which a high frequency power is applied is embedded in a portion above the heater 5 within the susceptor 2. A high frequency power supply 29 is connected to the electrode 27 via a matching unit 28, and, if necessary, a plasma can be generated by applying the high frequency power to the electrode 27 to perform a plasma CVD process. Further, three wafer lifting pins (not shown) are provided in the susceptor 2 so as to project or retract with respect to the top surface of the susceptor 2 and project from the top surface of the susceptor 2 when carrying the wafer W.

A circular opening 1b is formed at a ceiling wall 1a of the chamber 1, and a shower head 10 is fitted in the opening 1b to protrude toward the inside of the chamber 1. The shower head 10 is configured to inject a film forming gas supplied into the chamber 1 from a gas supply unit 30 to be described later. At a top portion of the shower head 10, a first gas inlet path 11 is provided to introduce therethrough a nickel-containing compound as a film forming source gas and a second gas inlet path 12 is provided to introduce therethrough $NH_3$ gas and $H_2$ gas as a reduction gas.

The nickel-containing compound used as the film forming source gas has a molecular structure in which a ligand containing a nitrogen-carbon bond is included and nitrogen of the ligand coordinates with nickel. For example, the nickel amidinate, such as Ni(II)N,N'-di-tertiary-butylamidinate (Ni(II)(tBu-AMD)$_2$) shown in FIG. 1 can be an example thereof. Further, additional examples of the nickel amidinate may include Ni(II)N,N'-di-isopropylamidinate (Ni(II)(iPr-AMD)$_2$); Ni(II)N,N'-di-ethylamidinate (Ni(II)(Et-AMD)$_2$), and Ni(II)N,N'-di-methylamidinate (Ni(II)(Me-AMD)$_2$) or the like.

An upper Space 13 and a lower space 14 are formed in the shower head 10. The upper space 13 is connected to the first gas inlet path 11, and a first gas injection path 15 extends from the upper space 13 to a bottom surface of the shower head 10. The lower space 14 is connected to the second gas inlet path 12, and a second gas injection path 16 extends from the lower space 14 to the bottom surface of the shower head 10. That is, the shower head 10 is configured to independently inject the Ni compound gas serving as the film forming source material, and the $NH_3$ gas or the $H_2$ gas through the injection paths 15 and 16, respectively.

A gas exhaust room 21 is provided at a bottom wall of the chamber 1 so as to be protruded downwardly. A gas exhaust line 22 is connected to a sidewall of the gas exhaust room 21 and is connected to a gas exhaust unit 23 having a vacuum pump or a pressure control valve. By operating the gas exhaust unit 23, the inside of the chamber 1 can be depressurized to a predetermined level.

A loading/unloading port 24 through which the wafer W is loaded and unloaded and a gate valve 25 for opening and closing the loading/unloading port 24 are provided at a sidewall of the chamber 1. Further, a heater 26 is provided around a wall of the chamber 1 to control a temperature of an inner wall of the chamber 1 during the film forming process.

The gas supply unit 30 includes a film forming source material tank 31 for storing therein the nickel amidinate, e.g., Ni(II)N, N'-di-tertiary-butylamidinate (Ni(II) (tBu-AMD)$_2$), which is the nickel-containing compound having a molecular structure which includes a ligand containing a nitrogen-carbon bond and nitrogen of the ligand coordinating with nickel, as a film forming source material. A heater 31a is provided around the film forming source tank 31, so that the film forming source material in the tank 31 can be heated to a proper temperature.

In order to supply Ar gas as a bubbling gas into the film forming source tank 61 from the above, a bubbling line 32 is inserted into the film forming source material tank 31 and immersed into the film forming source material. The bubbling line 32 is connected to an Ar gas supply source 33 and is provided with a mass flow controller 34 as a flow controller and valves 35, wherein the mass flow controller 34 is disposed between the values 35.

One end of a source gas feeding line 36 is inserted into the film forming source material tank 31 from above of the film forming source material tank 31, and the other end of the source gas feeding line 36 is connected to the first gas inlet path 11 of the shower head 10. A value 37 is provided in the source gas feeding line 36. Further, a heater 38 is provided to surround the source gas feeding line 36 to prevent condensation of the film forming source gas. By supplying the Ar gas as the bubbling gas to the film forming source material, the film forming source material is vaporized in the film forming source material tank 31 by the bubbling gas. The film forming source gas thus generated is supplied into the shower head 10 through the source gas feeding line 36 and the first gas inlet path 11.

The bubbling line 32 and the source gas feeding line 36 are connected to each other by a bypass line 48, and a valve 49 is provided in the bypass line 48. The bubbling line 32 includes a valve 35a provided at a downstream side of a connection portion between the bypass line 48 and the bubbling line 32, and the source gas feeding line 36 includes a valve 37a provided at a downstream side of a connection portion between the bypass line 48. By closing the valves 35a and 37a and opening the valve 49, the Ar gas from the Ar gas supply source 33 can be supplied as a purge gas or the like to the chamber 1 through the bubbling line 32, the bypass line 49, and the source gas feeding line 36.

A line 40 is connected to the second gas inlet path 12 of the shower head 10 and includes a valve 41. The line 40 is branched into branch lines 40a and 40b. An $NH_3$ gas supply source 42 is connected to the branch line 40a to introduce the ammonia gas ($NH_3$) serving as a reduction gas, and a $H_2$ gas supply source 43 is connected to the branch line 40b. Further, the branch line 40a includes a mass flow controller 44 as a flow rate controller and valves 45 disposed at an upstream and a downstream side of the mass flow controller 44, and the branch line 40b includes a mass flow controller 46 as a flow rate controller and valves 47 disposed at an upstream and a downstream side of the mass flow controller 46. Here, $NH_3$ may be replaced by hydrazine, $NH_3$ derivatives, and hydrazine derivatives or the like.

When the plasma CVD process is performed by applying the high frequency power to the electrode 27 if necessary, the line 40 may further include an additional branch line (not shown), which includes a mass flow controller and valves disposed at an upstream and a downstream side of the mass flow controller, thereby providing an Ar gas supply source for plasma ignition.

The film forming apparatus 100 further include a control unit 50 which controls the components, specifically the valves, the power supplies, the heaters, the pumps, and the like. The control unit 50 includes a process controller 51 having a microprocessor (computer), a user interface 52, and a storage unit 53. The process controller 51 is electrically connected to the components of the film forming apparatus 100 to control the components. The user interface 52 is connected to the process controller 51 and includes a keyboard through which an operator inputs commands for managing each component of the film forming apparatus, a display for visually displaying an operation status of each component of the film forming apparatus, and the like.

The storage unit 53 is also connected to the process controller 51 and stores therein a control program to implement various processes to be performed in the film forming apparatus 100 under the control of the process controller 51 and/or another control program, i.e., process recipes, various database and the like, to implement a predetermined process in each component of the film forming apparatus 100 depending on a process conditions. The process recipes are stored in a storage medium (not shown) in the storage unit 53. The storage medium may be configured as a static hard disk, or a portable CDROM, DVD, and flash memory or the like. Further, the recipes may be appropriately transmitted from another device, e.g., via a dedicated line.

If necessary, a desired process is performed in the film forming apparatus 100 under the control of the process controller 51 by reading a predetermined process recipe from the storage unit 53 in response to an instruction or the like from the user interface 52 and then executing the process recipe in the process controller 51.

Hereinafter, a nickel film forming method in accordance with the embodiment of the present invention, which is performed by the film forming apparatus 100, will be described.

Figure 2:
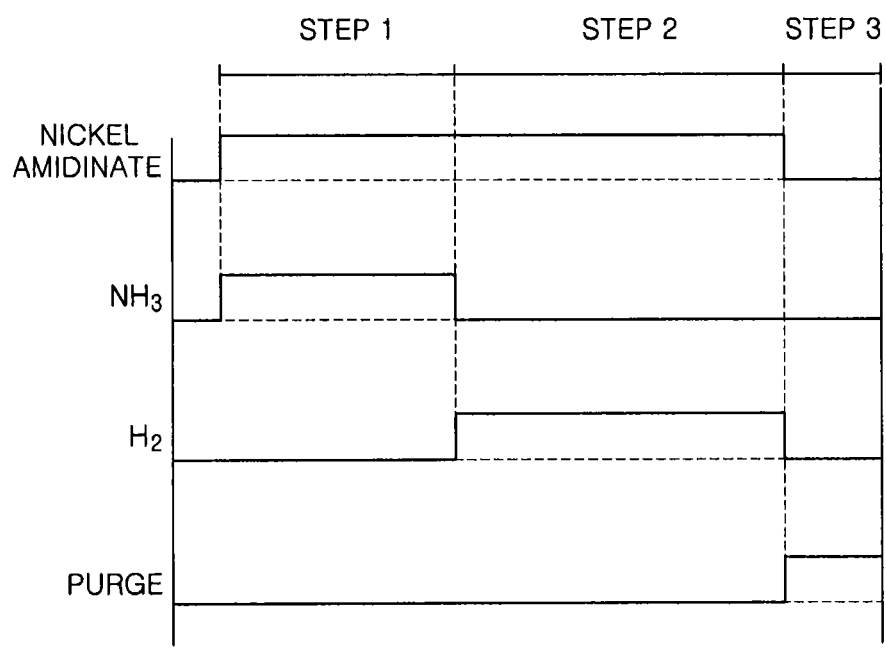
FIG. 2 is a timing view showing a sequence of the Ni film forming method in accordance with the embodiment of the present invention.

First, the gate valve 25 is opened, and a wafer W is loaded into the chamber 1 through the loading/unloading port 24 and mounted on the susceptor 2 by a transfer device (not shown). Next, the chamber 1 is exhausted by the gas exhaust unit 23 so that a pressure in the chamber 1 is set to a predetermined level. Then, the susceptor 2 is heated to a predetermined temperature. In this state, the following processes are sequentially carried out as shown in the timing view of FIG. 2: an initial film forming process (step 1) of forming an initial Ni film by supplying a nickel amidinate (a nickel-containing compound having a molecular structure which includes a ligand containing a nitrogen-carbon bond and nitrogen of th e ligand coordinating with nickel) as a film forming source material and $NH_3$ gas as a reduction gas; a main film forming process (step 2) of forming a main Ni film by changing the reduction gas from the $NH_3$ gas to $H_2$ gas while supplying the film forming source material, i.e., the nickel amidinate; and a purge process (step 3) of purging the inside of the chamber 1.

In the initial film forming process of the step 1, Ar gas is supplied as a bubbling gas to the nickel amidinate, e.g., Ni(II) N,N'-di-tertiary-butylamidinate $(Ni(II)(tBu-AMD)_2)$, stored as the film forming source material in the film forming source material tank 31. Accordingly, the nickel amidinate serving as the film forming source material is vaporized by the bubbling gas and then the vaporized nickel amidinate is supplied into the chamber 1 through the source gas feeding line 36, the first gas inlet path 11, and the shower head 10. Further, the $NH_3$ gas serving as a reduction gas is supplied from the $NH_3$ gas supply source 42 into the chamber 1 through the branch line 40a, the line 40, the second gas inlet path 12, and the shower head 10.

Here, the $NH_3$ gas may be replaced by hydrazine, $NH_3$ derivatives, and hydrazine derivatives. In other words, the reduction gas may be at least one selected from $NH_3$, hydrazine, and derivatives thereof. For example, monomethyl ammonium may be used as an ammonia derivative, and monomethyl hydrazine or dimethyl hydrazine may be used as a hydrazine derivative. Among these compounds, ammonia is preferably used. These compounds are a reducing agent having an unshared electron pair and easily reacts with the nickel amidinate. Hence, an initial Ni film can be formed on the surface of the wafer W at a relatively low temperature. The initial Ni film thus formed contains a large amount of impurities, such as a nickel nitride $(Ni_xN)$ formed by the nickel amidinate and N stemming from $NH_3$.

In the main film forming process of the step 2, the reduction gas is changed from the $NH_3$ gas to the $H_2$ gas while the nickel amidinate is supplied. Specifically, the supply of the $NH_3$ gas is stopped, and the $H_2$ gas is supplied from the $H_2$ gas supply source 43 into the chamber 1 through the branch line 40b, the line 40, the second gas inlet path 12, and the shower head 10. Accordingly, the nickel amidinate is reduced by the $H_2$ gas so that the Ni is further deposited on the initial Ni film, thereby forming a main Ni film. Then, the Ni film having a desired thickness and less impurities is obtained without annealing under a hydrogen atmosphere after forming the film.

In the main film forming process of the step 2, the film thickness is determined appropriately depending on the final thickness of the Ni film to be obtained and the thickness of the initial film. Further, a film forming time is preferably determined in advance based on the film thickness and a film forming rate.

In the purge process of the step 3, the valves 35a, 37a, and 47 are closed to stop the supply of the nickel amidinate and the $H_2$ gas, and the chamber 1 is evacuated to a vacuum level. At this time, if necessary, Ar gas may be supplied as a purge gas from the Ar gas supply source 33 into the chamber 1 through the bubbling line 32, the bypass line 48, and the source gas feeding line 36.

After the purge process terminates, the gate valve 25 is opened and the wafer W on which the film is formed is unloaded through the loading/unloading port 24 by the transfer device (not shown).

In the conventional case, when a Ni film is formed on a surface of a wafer W (generally, a surface of a Si substrate or a polysilicon film) by using a nickel amidinate as a film forming source material, a nucleus is not formed and Ni is not deposited even though $H_2$ is used as a reduction gas. Thus, the Ni film is formed by using a reducing agent having an unshared electron pair, e.g., $NH_3$, as in the method described in International Application Publication No. WO2011/040385.

However, when a Ni film is formed by using a reducing agent having an unshared electron pair such as $NH_3$, the film inevitably contains a nickel nitride $(Ni_xN)$. Thus, in International Application Publication No. WO2011/040385, the annealing process under a hydrogen atmosphere is necessarily involved to remove the nickel nitride, and such annealing process is carried out after the film forming process or the film forming process and the annealing process are repeated multiple times.

Aspects of the above processes are described as follows.

Nickel amidinate used as a film forming source material, more specifically, Ni(II)N,N'-di-tertiary-butylamidinate (Ni(II)(tBu-AMD)$_2$) has a structure represented by the following structural formula (I).

<Formula (1)>

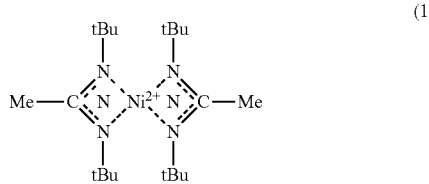

(1)

That is, an amidinate ligand is bonded to Ni acting as a nucleus, and Ni exists substantially as Ni$^{2+}$.

The reduction gas having an unshared electron pair, e.g., NH$_3$, is linked to the Ni nucleus of the above structured nickel amidinate existing as Ni$^{2+}$, and the amidinate ligand is decomposed. Accordingly, Ni$_x$N (x=3 or 4) is generated at satisfactory reactivity. Thus, in International Application Publication No. WO2011/040385, the annealing process under a hydrogen atmosphere is carried out to remove N in the Ni film, thereby obtaining a high-purity Ni film.

However, the annealing process performed after the film forming process leads to a decrease of a throughput. Therefore, if the film forming process and the annealing process are performed multiple times in order to obtain a higher-purity Ni film, the throughput is further decreased.

After extensive studies have been conducted to obtain a high-purity Ni film by reducing N in the film without decreasing the throughput, the following findings are acquired.

(1) Even though H$_2$ gas is used as a reduction gas, it is possible to further form a Ni film on an initial Ni film after the initial Ni film is formed by using a nickel amidinate as a film forming source material and NH$_3$ gas as a reduction gas having an unshared electron pair.

(2) In a case where the H$_2$ gas is used as the reduction gas, N is not introduced in the film, so that a high purity Ni film can be formed without forming Ni$_x$N.

(3) N contained in the initial Ni film can be removed by the H$_2$ gas as a reduction gas.

(4) In a case where a Ni film is further formed on the initial Ni film by using the nickel amidinate as the film forming source material and the H$_2$ gas as the reduction gas, a film forming rate becomes higher than a case where a Ni film is formed by using the nickel amidinate and NH$_3$.

In the present embodiment, based on the above findings, an initial film forming process is performed to create a nucleus by using a nickel amidinate as a film forming source material and NH$_3$ as a reduction gas having an unshared electron pair in the step 1, and then a main film forming process is performed by changing the reduction gas to H$_2$ gas while supplying the nickel amidinate in the step 2. Accordingly, a high-purity Ni film can be formed on the initial film including Ni$_x$N, and N in the initial film can be removed by the H$_2$ gas. As a result, a high purity Ni film as a whole can be formed. Here, an annealing process under a hydrogen atmosphere is not required. Further, since the film forming rate is higher in the main film forming process using the H$_2$ gas as the reduction gas than in a case where the NH$_3$ gas is used as the reduction gas, the throughput is remarkably increased as compared with the conventional case for forming the film by using the nickel amidinate and NH$_3$.

The initial film forming process of the step 1 and the main film forming process of the step 2 are preferably carried out under the following conditions: a pressure in the chamber 1 is set to be in a range from 66.5 to 1333 Pa (1 to 10 Torr); a temperature of the wafer W heated by the susceptor 2 (film forming temperature) is set to be in a range from 200 to 350° C.; a flow rate of the carrier Ar gas is set to be in a range from 50 to 500 mL/min (sccm); a flow rate of the NH$_3$ gas is set to be in a range from 10 to 2000 mL/min (sccm); and a flow rate of the H$_2$ gas is set to be in a range from 50 to 500 mL/min (sccm). Further, the temperature and the pressure in the step 1 is preferred to be equal to that in the step 2.

When the Ni film forming process in accordance with the present embodiment is performed on a silicon substrate or a polysilicon film, a nickel silicide (NiSi) can be produced by carrying out an annealing process under an inert gas atmosphere, such as an Ar gas atmosphere, after the Ni film is formed. In this case, since the Ni film having less impurities is formed in the present embodiment, the annealing process for silicidation may be performed within a short period of time.

Hereinafter, there will be described test results from an experiment to confirm the effects of the illustrative embodiment.

Here, a Ni film was formed in the following sequence of processes.

(1) A silicon wafer piece of 5 cm☐ was cleaned by a 0.5% hydrofluoric acid to remove a natural oxide film on a surface thereof.

(2) The cleaned wafer piece and a silicon wafer piece, in which a thermal oxide film having a thickness of about 100 nm is formed, were placed onto a silicon tray wafer having a diameter of 300 mm. Then, the silicon tray wafer was transferred in a vacuum atmosphere onto the susceptor 2 in the chamber 1 of the film forming apparatus 100 shown in FIG. 1 from a load lock chamber by the transfer device in a vacuum transfer chamber. The susceptor 2 was heated to about 254° C. by the heater 5.

(3) The wafer pieces on the tray wafer were left for 3 minutes to set their temperature to about 250° C. while supplying Ar gas at a flow rate of about 500 mL/min (sccm) to the chamber 1 and controlling the pressure in the chamber 1 to about 665 Pa (5 Torr).

(4) After 3 minutes, the supply of the Ar gas to the chamber 1 was stopped. Then, NH$_3$ gas was supplied at a flow rate of about 30 mL/min (sccm) to the chamber 1 and simultaneously Ni(II)N,N'-di-tertiary-butylamidinate (Ni(II)(tBu-AMD)$_2$) was supplied to the chamber 1 by bubbling by using Ar gas at a flow rate of 100 mL/min (sccm) as a carrier gas while the pressure in the chamber 1 was controlled to about 665 Pa (5 Torr). This initial Ni film forming process was performed for 3 to 5 minutes.

(5) Continuing to supply Ni(II)N,N'-di-tertiary-butylamidinate (Ni(II) (tBu-AMD)$_2$) by using the Ar carrier gas at the flow rate of about 100 mL/min (sccm), the supply of the NH$_3$ gas was stopped and H$_2$ gas at a flow rate of about 100 mL/min (sccm) was supplied while the pressure in the chamber 1 was controlled to about 665 Pa (5 Torr). This main Ni film forming process was performed for 90 seconds to minutes.

(6) The supply of all gases was stopped, and the inside of the chamber 1 was purged for about 20 seconds.

In this manner, various Ni films having different final thicknesses were obtained by varying the film forming time (test examples).

Further, for comparison, various Ni films including Ni$_x$N having different thicknesses were obtained by performing the film forming process merely including the processes (1) to (3) and the process (4) in which $NH_3$ gas is used as a reduction gas (Comparative examples).

Figure 3:
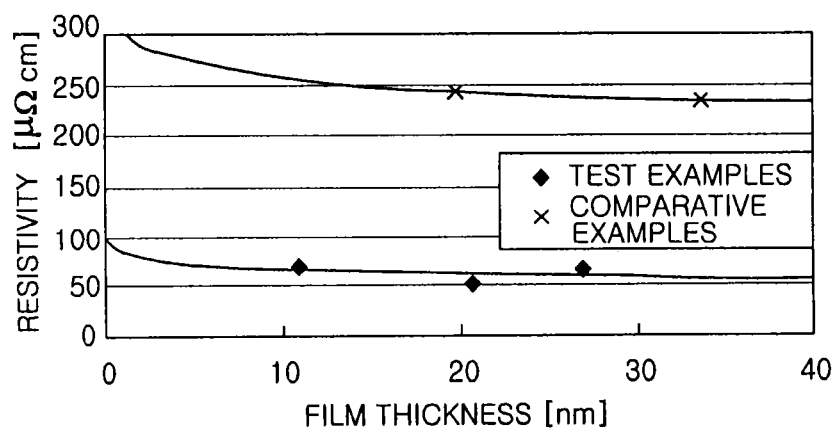
FIG. 3 is a graph showing a relationship between a thickness of Ni film and a resistivity thereof in a test example and that in a comparative example.

First, the resistivities of the Ni films in the test examples and the comparative examples were measured. The result is shown in FIG. 3. As shown in FIG. 3, it was found that the Ni films in the comparative examples had high resistivities of 200 μΩcm or greater, whereas the Ni films in the test examples had low resistivities of about a range from 50 to 70 μΩcm. This result presumably reflects that the Ni films in which $Ni_xN$ is formed in the comparative examples include a large amount of impurities while the Ni films in the test examples include less impurities.

Figure 4:
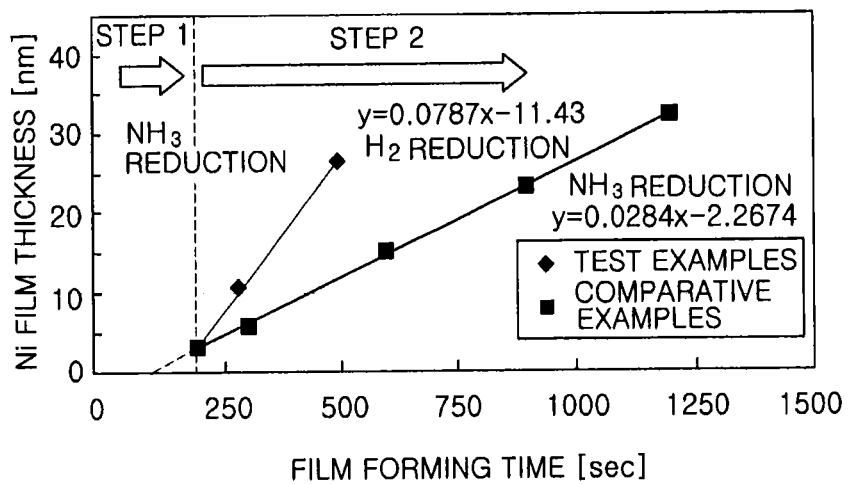
FIG. 4 is a graph showing a film forming rate of the Ni film in the test example and that in the comparative example, wherein a horizontal axis indicates a film forming time and a vertical axis indicates the thickness of a Ni film.

Next, film forming rates of the Ni films in the test examples and the comparative examples were analyzed. FIG. 4 shows the film forming rates of the Ni films in the test examples and the comparative examples, wherein the horizontal axis indicates a film forming time and the vertical axis indicates a thickness of a Ni film. As shown in FIG. 4, it was found that film forming rates of the Ni films in the test examples were about three times higher than those of the Ni films in the comparative examples since the film forming rate was high upon $H_2$ reduction in step 2 in the test examples in comparison with the comparative examples in which only $NH_3$ reduction was carried out.

Figure 5:
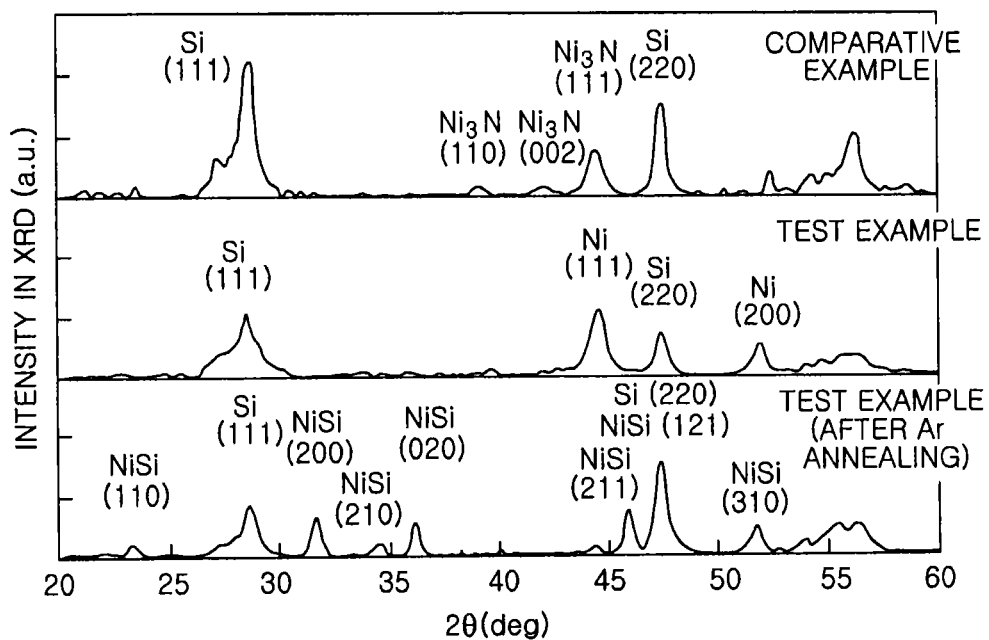
FIG. 5 is a XRD chart result of the Ni film in the test example, that of the Ni film in the comparative example and that of the Ni film after an Ar annealing process in the test example.

Next, crystal structures of the Ni films in the test examples and the comparative examples, and crystal structures of the Ni films in the test examples after an Ar annealing process was performed for 1 minute under the conditions of 400° C. and 400 Pa were analyzed by X-ray diffraction (XRD). FIG. 5 shows the XRD measurement results. As can be seen from the XRD chart, peaks of $Ni_3N$ were observed a lot in the Ni films in the comparative examples, which indicates that the nickel nitride was a main component in the Ni film. However, in the Ni films of the test examples, peaks of $Ni_3N$ were not observed and peaks of Ni were only observed as in a PVD-Ni film. Such a pattern presumably reflects that, by reduction with $H_2$ in step 2, a Ni film not including N was formed while N was separated from a N-containing Ni film formed in step 1. In the Ni films after the annealing process, peaks of NiSi were observed and it was found that a NiSi film was formed. Further, peaks of Si stem from a underlying polysilicon.

Next, film forming characteristics depending on different underlying films and reduction gases were analyzed. Specifically, Ni count rate was analyzed by a X-ray fluorescence (XRF) analysis in cases of a $H_2$-reduced Ni film formed on a polysilicon film (temperature: 240° C.), a $H_2$-reduced Ni film formed on a $NH_3$-reduced Ni film ($Ni_xN$ film, temperature: 250° C.), and a $NH_3$-reduced Ni film ($Ni_xN$ film) formed on a polysilicon film (temperature: 250° C.). The more the Ni count rates are, the greater the amount of Ni is in a film. Analysis results are shown in FIG. 6.

Here, the $H_2$ reduction is carried out by supplying Ni(II)N,N'-di-tertiary-butylamidinate ($Ni(II)(tBu-AMD)_2$) by bubbling with Ar gas at a flow rate of 100 mL/min (sccm) as a carrier gas and simultaneously supplying $H_2$ gas at a flow rate of 200 mL/min (sccm) as a reduction gas. Further, the $NH_3$ reduction is carried out by supplying $Ni(II)(tBu-AMD)_2$ in the same manner as the above and simultaneously supplying $NH_3$ gas at a flow rate of 45 mL/min (sccm) as a reduction gas.

Figure 6:
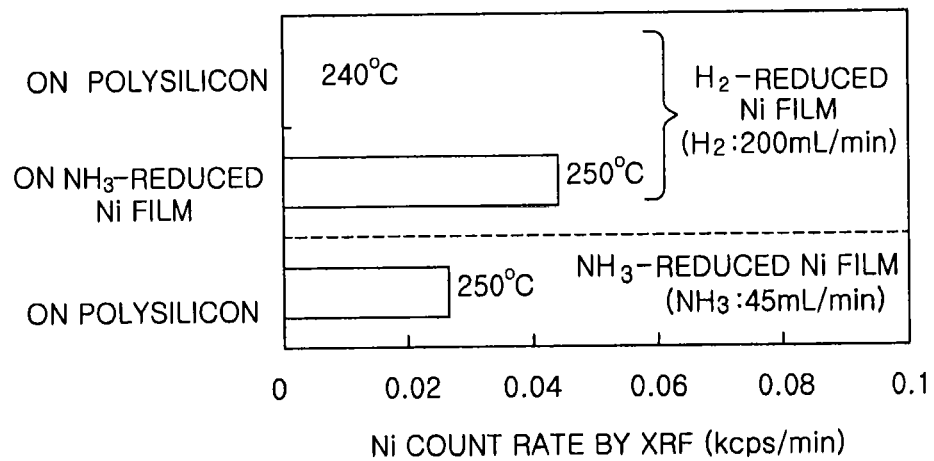
FIG. 6 shows a Ni count rate result by X-ray fluorescence analysis in a case where a $H_2$-reduced Ni film is formed on a polysilicon film, that in a case where a $H_2$-reduced Ni film is formed on a $NH_3$-reduced Ni film ($Ni_xN$ film), and that in a case where a $NH_3$-reduced Ni film ($Ni_xN$ film) is formed on a polysilicon film.

As shown in FIG. 6, the film formation could not be achieved on the polysilicon film in the $H_2$ reduction. However, in the case where a Ni film was previously formed on the substrate, it was found that a Ni film could be formed by the $H_2$ reduction. Further, a Ni count rate in the $H_2$ reduction was higher than that in the $NH_3$ reduction, and the amount of Ni was greater, i.e., the purity of Ni was considered higher (less impurities was contained), in the $H_2$ reduction than that in the $NH_3$ reduction.

Therefore, in accordance with the above embodiment, an initial Ni film including a nickel nitride, which can be formed on a substrate, is formed on the substrate by using a nickel-containing compound having a molecular structure in which a ligand containing a nitrogen-carbon bond is included and nitrogen of the ligand coordinates with nickel, and ammonia or the like, and subsequently a main Ni film, which is hardly formed directly on the substrate, is formed on the initial Ni film by using the nickel-containing compound and hydrogen gas. Accordingly, the main Ni film can be formed with less impurities, such as a nickel nitride, and N in the initial Ni film can be removed by the hydrogen gas. Therefore, a high-purity Ni film having less impurities can be obtained overall.

The present invention is not limited to the above-described embodiment, and may be variously modified. For example, in the above-described embodiment, $Ni(II)(tBu-AMD)_2$ as a nickel-containing compound having a molecular structure, in which a ligand containing a nitrogen-carbon bond is included and nitrogen of the ligand coordinates with nickel, is used as a film forming source gas. However, the compound may be a different type of a nickel amidinate or any other compound rather than the nickel amidinate.

Further, the structure of the film forming apparatus is not limited to that described in the above embodiment. Further, the method for supplying a film forming source material is not limited to that described in the above embodiment, and various methods may be employed.

In addition, although a semiconductor wafer is used as a substrate to be processed in the above embodiment, other substrates, such as a flat panel display (FPD) or the like, may also be employed.

While the invention has been shown and described with respect to the embodiments, it will be understood by those skilled in the art that various changes and modification may be made without departing from the scope of the invention as defined in the following claims.

What is claimed is:

1. A nickel film forming method comprising:
   forming an initial Ni film on a substrate by chemical vapor deposition (CVD) using a nickel-containing compound having a molecular structure in which a ligand containing a nitrogen-carbon bond is included and nitrogen of the ligand coordinates with nickel as a film forming source material and at least one selected from ammonia, hydrazine, and derivatives thereof as a first reduction gas, wherein the initial Ni film comprises nitrogen; and
   forming a main Ni film on the initial Ni film while removing the nitrogen from the initial Ni film, by CVD using the nickel-containing compound as the film forming source material and hydrogen gas as a second reduction gas,
   wherein the first reducing gas is different from the second reduction gas.

2. The nickel film forming method of claim 1, wherein the nickel-containing compound is a nickel amidinate.

3. The nickel film forming method of claim 1, wherein said forming the initial Ni film and said forming the main Ni film are carried out at a temperature ranging from 200 to 350° C.

4. The nickel film forming method of claim 2, wherein said forming the initial Ni film and said forming the main Ni film are carried out at a temperature ranging from 200 to 350° C.

5. The nickel film forming method of claim 1, wherein said forming the initial Ni film and said forming the main Ni film are carried out at a pressure ranging from 66.5 to 1333 Pa.

6. The nickel film forming method of claim 2, wherein said forming the initial Ni film and said forming the main Ni film are carried out at a pressure ranging from 66.5 to 1333 Pa.

7. The nickel film forming method of claim 1, wherein said forming the initial Ni film and said forming the main Ni film are carried out at the same temperature and the same pressure.

8. The nickel film forming method of claim 2, wherein said forming the initial Ni film and said forming the main Ni film are carried out at the same temperature and the same pressure.

9. The nickel film forming method of claim 1, wherein in said forming the initial Ni film, the nickel-containing compound and the first reduction gas are supplied simultaneously, and in said forming the main Ni film, the nickel-containing compound and the second reduction gas are supplied simultaneously.

* * * * *